United States Patent [19]

Roques et al.

[11] 4,283,247
[45] Aug. 11, 1981

[54] LIQUID PHASE EPITAXIAL PROCESS FOR MAGNETIC GARNET

[75] Inventors: Rodney A. Roques, Austin, Tex.; Gene F. Wakefield, Chatsworth, Calif.

[73] Assignee: Texas Instruments Incorporated, Dallas, Tex.

[21] Appl. No.: 50,587

[22] Filed: Jun. 21, 1979

[51] Int. Cl.³ .............................................. C30B 19/02
[52] U.S. Cl. .................................. 156/601; 156/624; 156/DIG. 63
[58] Field of Search ............... 156/624, 621, 622, 608, 156/601, DIG. 63; 422/247, 248, 253; 427/86; 118/416

[56] References Cited

U.S. PATENT DOCUMENTS

| | | | |
|---|---|---|---|
| 2,035,990 | 3/1936 | Siegler | 156/622 |
| 2,459,869 | 1/1949 | Christensen et al. | 422/248 |
| 3,697,320 | 10/1972 | Hiskes | 156/624 |

*Primary Examiner*—Hiram Bernstein
*Attorney, Agent, or Firm*—Mel Sharp; Richard Donaldson; Gary Honeycutt

[57] ABSTRACT

The liquid phase epitaxial growth of a magnetic garnet film is obtained by providing a circulating flux solution of the material, wherein spaced apart zones are maintained at different temperatures, above and below the saturation point; and by placing a preheated substrate in contact with the supersaturated zone, wherein a suitable growth temperature is maintained. This system avoids the prior need for heating and cooling the entire solution as a single, thermally uniform zone, and thereby achieves a substantial savings in time which permits at least a ten-fold increase in production rates, without increasing manpower or capital investment.

3 Claims, 3 Drawing Figures

LIQUID PHASE EPITAXIAL PROCESS FOR MAGNETIC GARNET

This invention relates to the liquid phase epitaxial growth of crystalline materials, and more particularly to a process and apparatus for the liquid phase epitaxial growth of a magnetic garnet film wherein a substrate is placed in contact with a circulating flux solution of garnet-forming oxides.

It has been the usual practice in the industry to grow epitaxial films of magnetic garnet in the classic manner of contacting a substrate with a thermally uniform flux solution of garnet-forming oxides, which requires a thermal cycling of the entire mass of the solution for each production run. Thus, an average of only three to four slices can be produced per hour from each bath, due to the five or six hours required for heating and cooling the solution for each production run.

The system of the present invention avoids the prior need for heating and cooling the entire solution as a single, thermally uniform zone, and thereby achieves a substantial savings in time, amounting to at least a tenfold increase in production rates, without increasing manpower or capital investment.

Instead, our system provides a circulating flux solution of the solute material or materials to be grown, including a first zone having a selectively controlled temperature above the saturation point, and a second zone spaced therefrom, wherein a lower temperature is maintained, below the saturation point, where the epitaxial growth is carried out.

As the flux solution is circulated from the first zone to the second zone, it passes through a transition zone of decreasing temperatures, in the direction of flow.

The substrate is preheated to approximately the same temperature as the second zone, just prior to being placed in contact with the flux solution. At the end of a suitable growth period, the substrate is removed and replaced by another substrate, and so on. Thus, even though the substrates may be processed one at a time, there will be sufficient time to process several dozen slices per hour, totalling as many as 200 or more in the five-hour period required previously for thermally cycling the entire flux solution once as a single uniform mass.

Although the invention is applicable to the epitaxial growth of other crystalline materials which form a supersaturated flux solution, the rare earth garnets are of particular interest, represented generally by the formula $R_3Fe_5O_{12}$ where R is yttrium, lanthanum, or a rare earth atom (atomic numbers 58–71). These are the magnetic garnets, used to fabricate bubble memory devices.

The preferred embodiment, illustrated for purposes of this disclosure is an epitaxial film of $$(Y_{1.5}Sm_{0.3}Lu_{0.3}Ca_{0.9})(Ge_{0.9}Fe_{4.15})O_{12}$$

grown on a substrate of monocrystalline $Gd_3Ga_5O_{12}$.

The solution for growing the above film is preferably a lead oxide/boron oxide flux solution containing the oxides of the remaining elements in the following ratios:

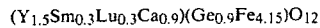

| Oxide | Mol % |
| --- | --- |
| Y | 0.327 |
| Sm | 0.042 |
| Lu | 0.055 |
| Ca | 2.710 |
| Fe | 10.014 |
| Ge | 2.209 |
| Pb | 79.544 |
| B | 5.099 |

As readily appreciated by one skilled in the art, the mol ratio of the atoms in the flux differs from the ratio in the grown film, because their segregation coefficients are different. Therefore, in order to sustain the proper ratio in the flux, it becomes necessary to replenish the oxides in the flux, in the same amounts, and in the same ratios that they are removed by growth. This is done by adding oxides to the circulating flux, preferably in zone one, where the maximum temperatures are maintained.

Figure 1:
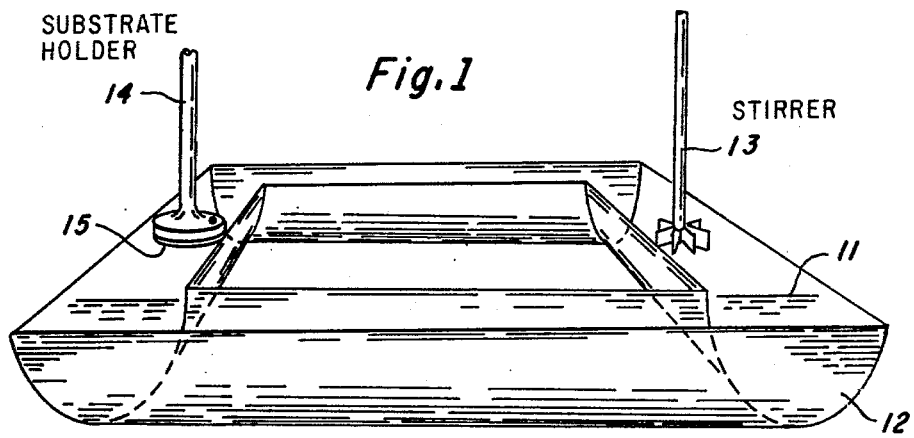
FIG. 1 is a perspective view of the vessel wherein the flux solution is circulated in accordance with one embodiment of the invention.

In FIG. 1 the circulating flux solution 11 is shown, traversing a rectangular path in platinum-lined zinconia crucible 12, propelled by a stirrer 13. A substrate holder 14 lowers a preheated slice 15 into contact with the flux for epitaxial growth. The crucible is enclosed in a furnace system (not shown) including heating means, insulation, and control means for selectively maintaining a temperature of about 960° C. in the growth zone, about 1000° C. in the opposite leg of the crucible, and transition temperatures in the zones of the intermediate legs.

Figure 2:
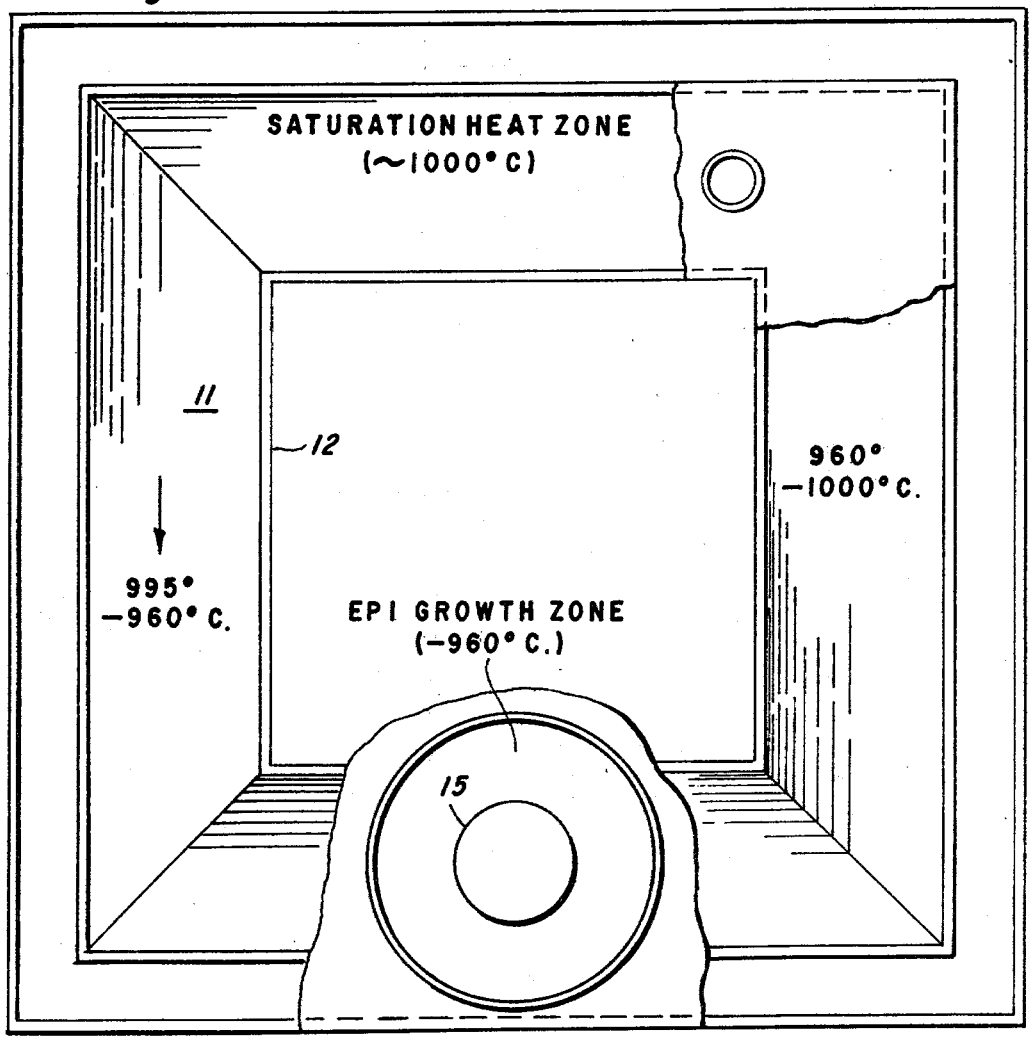
FIG. 2 is a top view of the vessel of FIG. 1.

In FIG. 2 the temperature zones of the flux solution are more clearly illustrated, relative to the growth zone, the impeller, and the replenishing port for adding flux oxides. The slice preheater is directly above the port for slice entry and removal.

Figure 3:
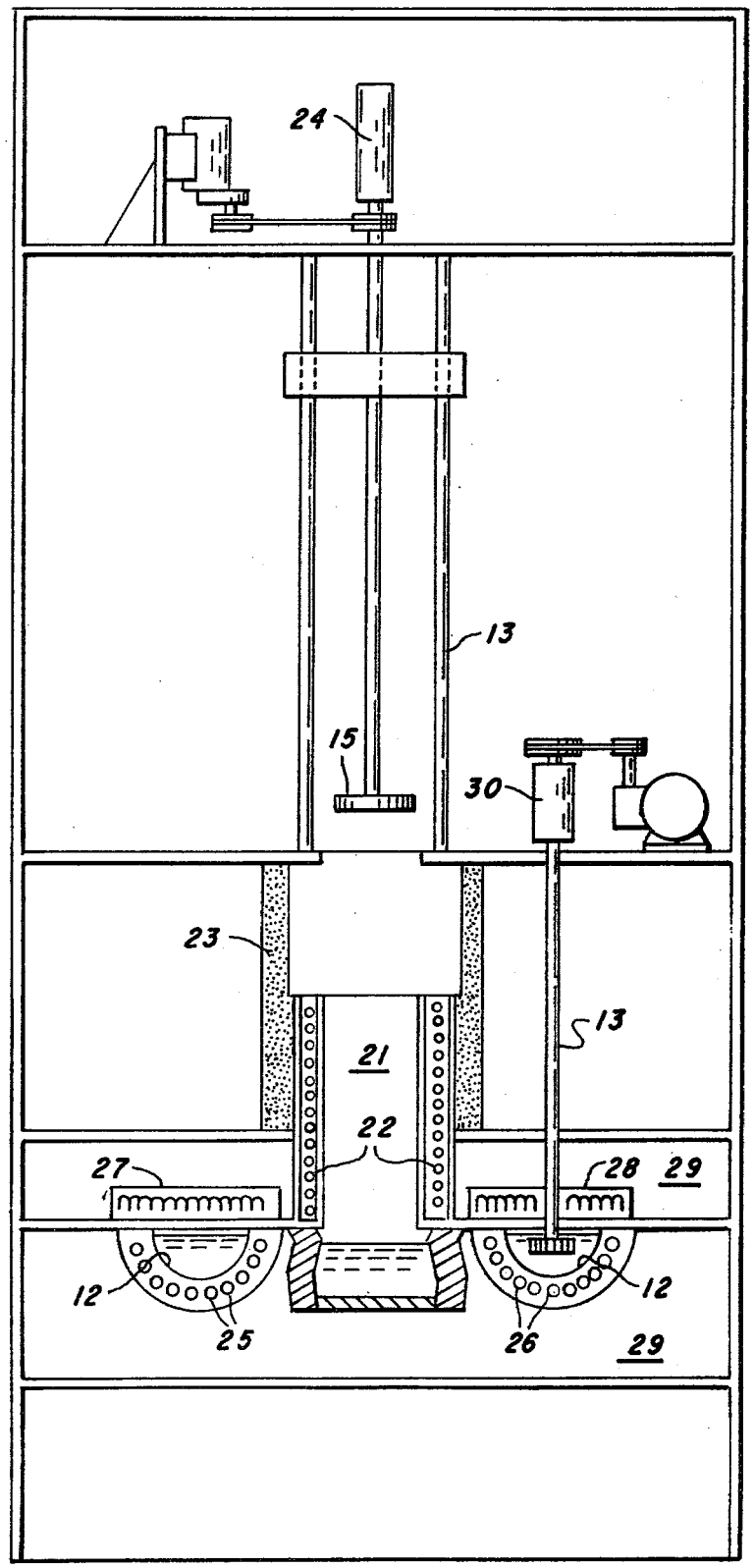
FIG. 3 is a cut-away plan view, partly in cross section, showing the furnace system and slice preheater of the invention, including the vessel of FIGS. 1 and 2.

FIG. 3 shows the slice preheater 21, including heating elements 22, insulation 23, and drive mechanism 24 for raising and lowering a slice 15. Crucible 12 is shown in cross-sections through opposite legs thereof, surrounded by heaters 25, 26, 27 and 28, and insulation 29. The impeller 13 is driven by mechanism 30.

Numerous other magnetic garnet films are known, which may be grown using the process and apparatus of the invention. Other crystalline materials are also contemplated for growth, including particularly any materials which form substantially stable supersaturated flux solutions. Examples include III–V compounds such as GaAs, GaP and GaAlAs. Also semiconductors such as silicon may be grown from tin or lead solution.

Prior methods have usually produced epitaxial layers of non-uniform composition, as measured from point to point on the surface of the slice, and also as a function of layer thickness, due to localized depletion of oxides from the flux; and due to variations in growth time introduced by techniques for handling multiple-slice batches. Substantially uniform growth layers are achieved by this invention, since there is only one slice at a time in contact with the flux, and since there is more circulation of the flux across the face of the slice. In addition to the essential circulatory transport of flux through the growth zone, there is a localized "pumping" action in the preferred embodiment, caused by spinning the slice during growth, which by centrifugal action moves the adjacent flux radially outward from the center of the slice; and consequently the more distant flux is drawn perpendicularly toward the center of the slice to maintain a local stirring motion.

Uniformity is further enhanced, in accordance with one embodiment, whereby instant removal of the flux that clings to the slice is achieved at the end of the growth period by temporarily accelerating the rate of slice spin just as and shortly after the slice is separated from the flux surface.

The crucible of the illustrated system measures approximately 12 inches along the center of each side, and holds about 2400 c.c. of flux solution. The rate of circulation is about one cm. per minute. The rate of circulation is not a critical parameter of the invention, but is normally controlled in the range of 0.5 to 3 cm./min., depending upon the thermal character of the system. That is, the rate must be fast enough to offset localized depletion of oxides in the growth zone, but not fast enough to disturb the desired thermal equilibrium of the system. For example, the growth zone temperature is held substantially constant, in the range of 5°–25° C. below the saturation temperature, and the maximum temperature zone is held substantially constant, in the range of 5°–25° C. above the saturation temperature.

These thermal and circulatory parameters apply generally to the other systems mentioned, as well as to the magnetic garnet system.

We claim:

1. A method for the liquid phase epitaxial growth of a crystalline magnetic garnet material on a suitable substrate comprising the steps of:
    (a) providing a circulating $P_bO$—$B_2O_3$ flux solution of a magnetic garnet;
    (b) selectively controlling the temperature within separated zones of said solution to provide a first zone maintained at a temperature higher than the saturation point; and a second zone remote from said first zone, maintained at a temperature below the saturation point; and third and fourth intermediate zones wherein said solution is circulated, while cooling, from said first zone to said second zone, and is returned from said second zone to said first zone at increasing temperatures, respectively, each of said zones having a common surface level;
    (c) preheating the substrate to a suitable growth temperature;
    (d) and placing a surface thereof in contact with the surface of said second zone for a time sufficient to deposit an epitaxial layer of said solute material thereon.

2. A method as in claim 1 wherein the substrate is gadolinium gallium garnet and the epitaxial film is $$(Y_{1.5}Sm_{0.3}Lu_{0.3}Ca_{0.9})(Ge_{0.9}Fe_{4.15})O_{12},$$

grown from a PbO—$B_2O_3$ flux solution.

3. A method as in claim 2 wherein the temperature of the growth zone is about 960° C., and the saturation zone about 1000° C.

* * * * *